(12) United States Patent
Yokoyama et al.

(10) Patent No.: US 6,565,654 B2
(45) Date of Patent: May 20, 2003

(54) PROCESS AND APPARATUS FOR PRODUCING A PLANAR BODY OF AN OXIDE SINGLE CRYSTAL

(75) Inventors: Toshihisa Yokoyama, Nagoya (JP); Masahiro Murasato, Nagoya (JP); Katsuhiro Imai, Nagoya (JP); Minoru Imaeda, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 1 day.

(21) Appl. No.: 09/897,797

(22) Filed: Jul. 2, 2001

(65) Prior Publication Data

US 2002/0029736 A1 Mar. 14, 2002

(30) Foreign Application Priority Data

Jul. 5, 2000 (JP) ........................................ 2000-203633

(51) Int. Cl.[7] ............................. C30B 21/02; C30B 21/04
(52) U.S. Cl. ............................. 117/81; 117/83; 117/200
(58) Field of Search ............................. 117/13, 14, 81, 117/83, 200

(56) References Cited

U.S. PATENT DOCUMENTS

| | | |
|---|---|---|
| 5,690,734 A | 11/1997 | Imaeda et al. |
| 5,919,304 A * | 7/1999 | Imaeda et al. ................. 117/16 |
| 5,961,720 A * | 10/1999 | Imaeda et al. ............... 117/214 |
| 6,036,775 A * | 3/2000 | Imaeda et al. ............... 117/214 |

FOREIGN PATENT DOCUMENTS

| | | |
|---|---|---|
| EP | 0 733 728 A2 | 9/1996 |
| JP | 08-319191 | 12/1996 |

OTHER PUBLICATIONS

Yoon, D.H., et al. "Morphological aspects of potassium lithium niobate crystals with acicular habit grown by the micro–pulling–down method." Journal of Crystal Growth. (1994) 207–212.

* cited by examiner

Primary Examiner—Felisa Hiteshew
(74) Attorney, Agent, or Firm—Burr & Brown

(57) ABSTRACT

In a process for producing a planar body of an oxide single crystal with a $\mu$ pulling-down method, a shoulder portion having a larger width is grown without any polycrystal regions, cracks or crystal deteriorations in a central portion of the planar body. A raw material of the oxide single crystal is melted in a crucible. A seed crystal is contacted to a melt of the raw material near an opening of a nozzle 13 of the crucible. Then, the melt 18 is drawn from the opening by pulling down the seed crystal to form a planar body 14A. A temperature distribution of the nozzle 13 in a direction perpendicular to the drawing direction B is controlled by supplying heat to the nozzle 13 and/or by removing heat from the nozzle 13.

26 Claims, 8 Drawing Sheets

PROCESS AND APPARATUS FOR PRODUCING A PLANAR BODY OF AN OXIDE SINGLE CRYSTAL

BACKGROUND OF THE INVENTION

1. Field of the Invention

The present invention relates to a process and an apparatus for producing a planar body of an oxide single crystal.

2. Description of the Related Art

A single crystal of lithium potassium niobate and a single crystal of lithium potassium niobate-lithium potassium tantalate solid solution have been noted especially as single crystals for blue light second harmonic generation (SHG) devices for semiconductor lasers. The devices can emit even the ultraviolet lights having the wavelengths of down to 390 nm, thus the crystals can be suitable for wide applications such as optical disk memories, medicine and photochemical fields, and various optical measurements by using such short-wavelength lights. Since the above single crystals have a large electro-optic effect, they can be also applied to optical memory devices using their photo-refractive effect.

However, for the application of a second harmonic generation device, for example, even a small fluctuation in the composition of the single crystal may affect the wavelength of the second harmonic wave generated by the device. Therefore, a specific range of the composition required for said single crystals is severe, and the fluctuation in the composition should be suppressed in a narrow range. However, since the composition consists of as many as three or four components, growing a single crystal at a high rate is generally extremely difficult to achieve, while controlling the proportions of the components to be constant.

In addition, for optical applications, especially for the second harmonic wave generation, a laser beam having a short wavelength of, for example, about 400 nm needs to propagate in the single crystal at as high a power density as possible. Moreover, the photo deterioration has to be controlled to the minimum at the same time. In this way, since controlling the photo deterioration is essential, the single crystal has to possess good crystallinity for this purpose.

NGK Insulators, Ltd. suggested a $\mu$ pulling-down method for growing such a single crystal with a constant compositional proportions, for example, in JP-A-8-319191. In this method, a raw material, for example, comprising lithium potassium niobate is put into a platinum crucible and melted, and then the melt is pulled out downwardly gradually and continuously through a nozzle attached to the bottom of the crucible. The $\mu$ pulling-down method can grow a single crystal more rapidly than the CZ method or the TSSG method does. Moreover, the compositions of the melt and the grown single crystal can be controlled by growing the single crystal continuously while supplementing the raw materials for growing the single crystal to the raw material melting crucible.

However, there is still a limitation in using the $\mu$ pulling-down method to grow a good single crystal plate (a planar body of a single crystal) continuously at a high rate.

The present inventors tried to form a shoulder portion or shoulder portions by adjusting the temperature of the melt, the ambient temperature around a fiber, etc. when an oxide single crystal fiber (seed crystal) was firstly contacted to a melt and then the melt was pulled down. The width of the shoulder portion is gradually enlarged, and when it reaches the desired size, temperatures of such as a nozzle portion are slightly raised to stop the increase in width of the shoulder portion. After that, a planar body having a uniform width is continuously pulled down following a terminal end of the shoulder portion. According to this method, cracks are hard to progress from near a joint interface of the seed crystal and the planar body.

However, during further examination of this method, the following problems arouse. That is, although the width of the shoulder portion was being gradually enlarged as the shoulder portion of the planar body was being grown, the width of the shoulder portion stopped enlarging and could not reach a desired width (e.g. 80 mm) if the width exceeded a certain extent.

Moreover, in some cases, although the width of the shoulder portion reached a desired width, polycrystal regions, cracks and crystal deteriorations occurred in a central portion of the shoulder portion in some cases.

SUMMARY OF THE PRESENT INVENTION

It is an object of the present invention to be able to grow a shoulder portion having a larger width and to prevent polycrystal regions, cracks and crystal deteriorations in the central portion of the planar body, when the planar body of the oxide single crystal is grown with the $\mu$ pulling-down method.

The present invention relates to a process for producing a planar body of an oxide single crystal, said process comprising the steps of melting a raw material of said oxide single crystal in a crucible, contacting a seed crystal to a melt of the raw material near an opening of a nozzle of the crucible, drawing said melt from said opening by pulling down the seed crystal, and growing said planar body, wherein the vertical temperature distribution of said nozzle against said drawing direction is controlled by supplying heat to the nozzle and/or removing heat from the nozzle.

The present invention also relates to an apparatus for producing a planar body of an oxide single crystal comprising a crucible for melting a raw material of said oxide single crystal and temperature controlling unit, said crucible having a nozzle provided with an opening and said temperature controlling unit controlling a vertical temperature distribution of said nozzle against said drawing direction by supplying heat to the nozzle and/or by removing heat from the nozzle, wherein a seed crystal is contacted to said melt and the oxide single crystal is grown by pulling down the seed crystal to draw said melt from said opening of the crucible.

BRIEF DESCRIPTION OF THE DRAWINGS

For the better understanding of the present invention, reference is made to the accompanying drawings, in which.

DETAILED DESCRIPTION OF THE INVENTION

The present inventors firstly investigated the cause of stopping the enlargement of the width of the shoulder portion, when the planar body of the oxide single crystal was grown by the μ pulling-down method.

Figure 1A:
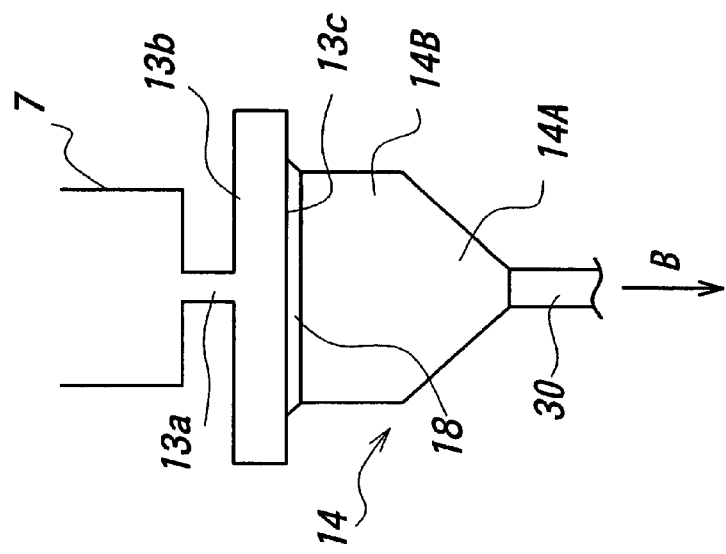
FIGS. 1(a), 1(b) and 1(c) are schematic diagrams showing each step of the process for drawing the planar body 14 with the $\mu$ pulling down method.
Figure 1B:
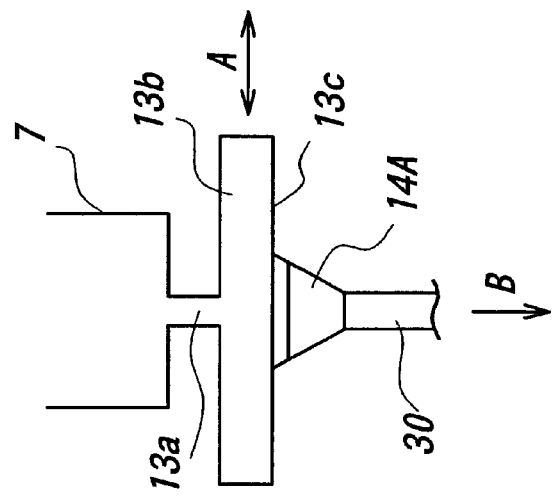
Figure 1C:
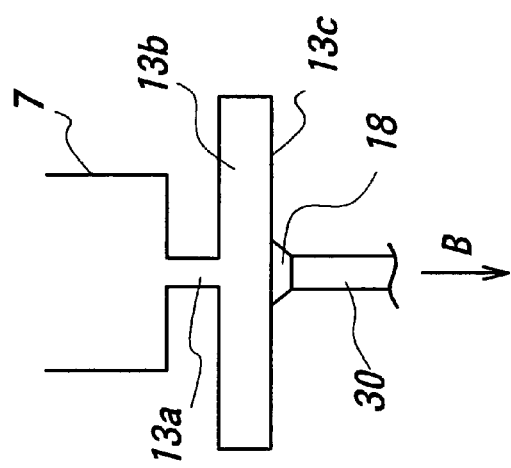

FIGS. 1(a) to (c) schematically illustrate each step of process for drawing the planar body. The arrows B represent a drawing direction of the single crystal.

As shown in FIG. 1(a), a fibrous seed crystal 30 is moved upwardly, and an upper surface of the seed crystal 30 is contacted to a melt protruding from an opening 13c of a nozzle 13. At this time, a uniform solid phase-liquid phase interface (meniscus) is formed between the upper end of the seed crystal 30 and the melt 18 pulled downwardly from the nozzle 13. Then, the seed crystal 30 is drawn downwardly as shown in FIG. 1(b). As a result, a shoulder portion 14A is continuously formed on an upper side of the seed crystal 30 and pulled downwardly. The width of the shoulder portion 14A gradually increases as viewed in a direction from the seed crystal to the crucible. The angle of the shoulder portion depends on the type and the composition of the crystal. When the temperature of the nozzle is slightly raised, the shoulder portion 14A stop increasing its width, and the planar body 14B with a constant width is continuously pulled out after that.

The present inventors conceived that an angle of the melt α became smaller at near a contacting face between the shoulder portion 14A and the melt 18, thus the shoulder portion didn't increase its width when the seed crystal was pulled down. It was considered that the temperature at regions of both the ends of the shoulder portion increased so high that the angle of the melt α became smaller.

The present inventors tried to increase the angle of the melt α again and to enlarge the width of the shoulder portion by slightly reducing the electric power to be supplied to the nozzle 13 when the shoulder portion 14A stopped increasing its width. However, in this case, polycrystal regions, cracks and deteriorations might occur at near the central portion of the acquired planner body 14. The reason of this is considered that the temperature of the central portion of the planar body decreased too much as compared with the optimum temperature.

In this way, by controlling the electric power to be supplied to the nozzle or the ambient temperature near the single crystal growing point alone, it was impossible to prevent stopping the enlargement of the width of the shoulder portion, and to simultaneously prevent the polycrystal regions, the cracks and the deteriorations from occurring at near the central portion of the planar body. The present inventors examined this reason, and found that although no trouble occurred while the width of the shoulder portion was narrow, the central portion of the shoulder portion 14A acted as a kind of a radiator to remove heat from near the interface between the shoulder portion and the melt, thus the temperature of the central portion of the interface between the shoulder portion and the melt became lower than that of both the ends of the shoulder portion, when the width of the shoulder portion 14A was large. As a result, the temperature of the central portion of the shoulder portion became lower than the optimum temperature, and the polycrystal regions, the cracks and the deteriorations occurred. On the other hand, when the temperature of the central portion of the shoulder portion was within the optimum temperature range, the temperature of both the ends of the shoulder portion became excessively high to cause the stopping of the enlargement of the width of the shoulder portion as mentioned above.

Based on these discoveries, the present inventors conceived to control the temperature distribution of the nozzle 13 in a direction A vertical to against the drawing direction by supplying the heat to the nozzle and/or by removing the heat from the nozzle. By so doing, said temperature distribution of the nozzle and a resultant temperature distribution of the interface between the melt and the single crystal can be reduced to solve said problems.

DESCRIPTION OF THE PREFERRED EMBODIMENT

Figure 2:
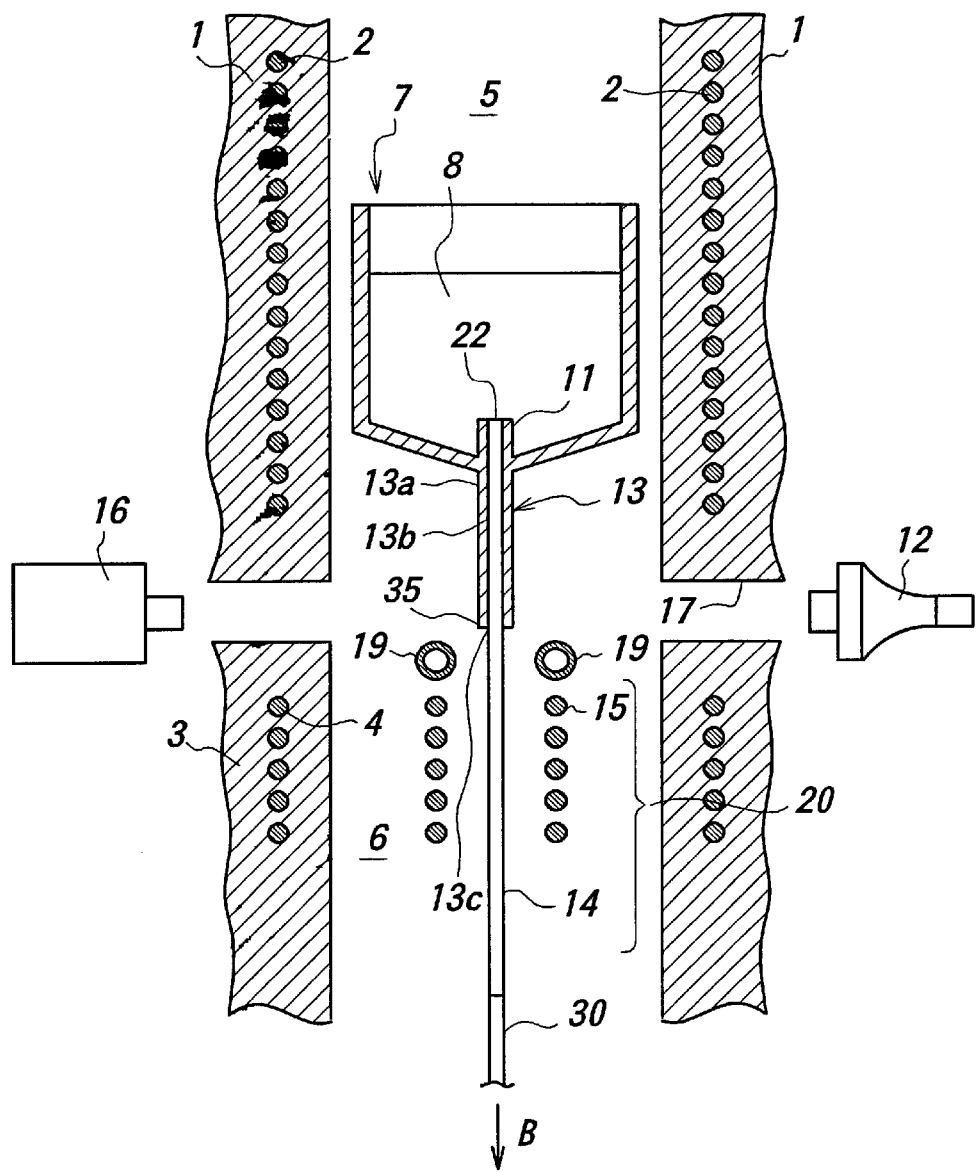
FIG. 2 is a schematic diagram of a manufacturing apparatus usable for the present invention.
Figure 3:
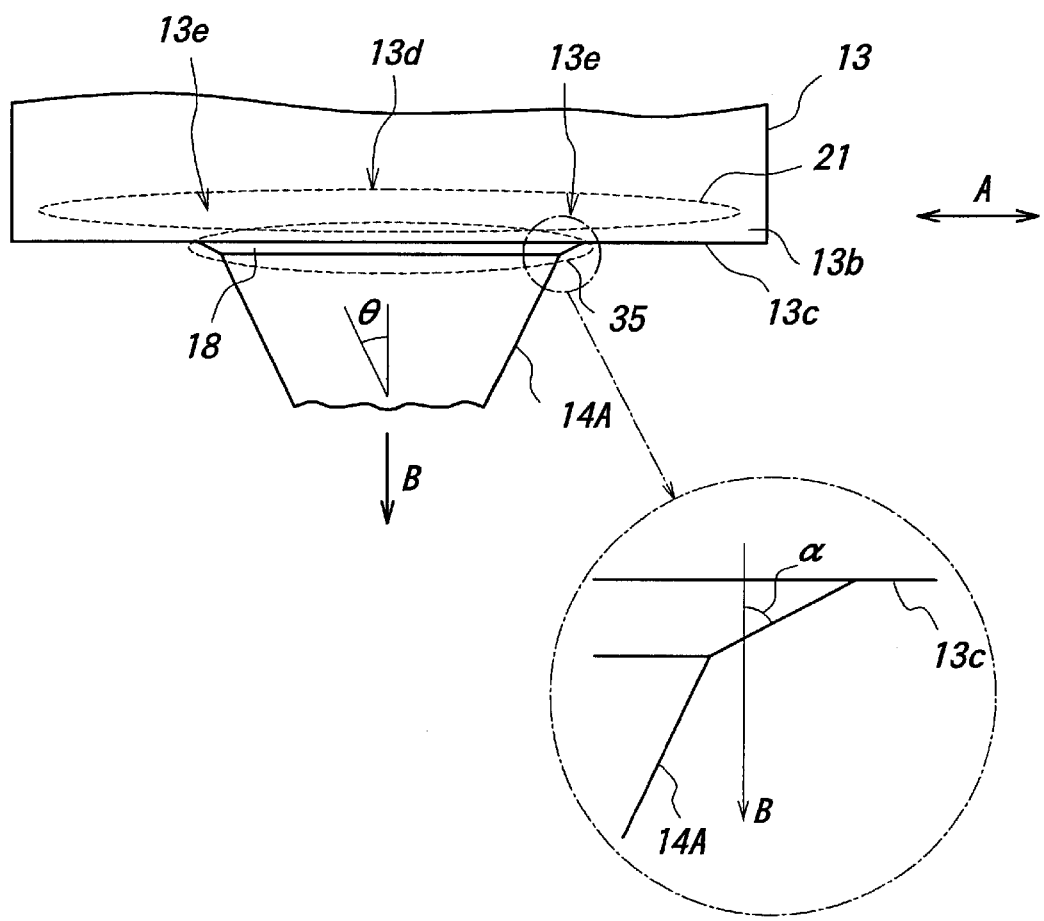
FIG. 3 is an enlarged view near the interface between the shoulder portion 14A and the nozzle 13.

The present invention will be further explained in detail hereinafter with reference to the accompanying drawings. FIG. 2 is a schematic diagram of a manufacturing apparatus usable for the present invention. FIG. 3 is an enlargement view near the interface between the shoulder portion 14A and the nozzle 13.

A crucible 7 is placed in a furnace body. An upper furnace unit 1 is arranged to surround the crucible 7 and an upper space 5 thereof, and has a heater 2 buried therein. A heater 4 is buried in a lower furnace unit 3. A nozzle 13 extends downwardly from a bottom part of the crucible 7. The nozzle 13 comprises a connecting-tube portion 13a and a planar expanded portion 13b at the lower end of the connecting-tube portion 13a. In FIG. 2, only a cross sectional view of the planar expanded portion 13b is shown. The connecting-tube portion 13a and the planar expanded portion 13b can be changed variously in shape.

An opening 13c is formed at the lower end of the planar expanded portion 13b, and a region near the opening 13c is a single crystal-growing portion 35. An intake tube 11 extends upwardly in the crucible 7 and an intake opening 22 is provided at the upper end of the intake tube 11. The intake opening 22 slightly protrudes from a bottom portion of a melt 8. The crucible 7 and the nozzle 13 are both formed from a corrosion-resistant conductive material. Power sources not shown are respectively connected to the crucible 7 and the nozzle 13, and the electric power to be supplied to them can be controlled.

A cooler 19 is provided adjacent to a planar body 14 immediately under the opening 13c of the nozzle portion 13, and an after-heater 15 is provided under the cooler 19. The after-heater 15 is provided in an anneal region 20.

The temperature distribution in each of the spaces 5 and 6 is set appropriately by generating heat from the upper furnace unit 1, the lower furnace unit 3 and the after-heater 15, and by operating the cooler 19. Then a raw material for the melt is supplied into the crucible 7 and the electric power is supplied to the crucible 7 and the nozzle 13 for heating. In this condition, the melt slightly protrudes from the opening 13c at the single crystal-growing portion 35.

A tool microscope 12 and a radiation thermometer 16 are installed outside the furnace bodies. A clearance is provided between the upper furnace unit 1 and the lower furnace unit 3 to be able to observe the inside of the furnace bodies through the clearance. Near the single crystal-growing portion 35 of the nozzle 13 is visually observed with the tool microscope 12. By so doing, a configuration of the melt 18, the planar body 14 and particularly a gradient angle θ of the shoulder portion 14A against a drawing axis B can be observed. Moreover, a temperature distribution as viewed in the horizontal direction A (perpendicular to the drawing direction) at a lower portion 21 of the nozzle 13 is observed with the radiation thermometer 16.

In an embodiment of the present invention, the amount of heat supplied to a vicinities 13e of both the ends of the planar body of the nozzle 13 is set smaller than the amount of heat supplied to a central portion 13d of the nozzle 13 as viewed in a direction perpendicular to the drawing direction. By so doing, a temperature difference between the central portion 13d and the vicinities 13e of both the ends can be reduced.

Figure 4:
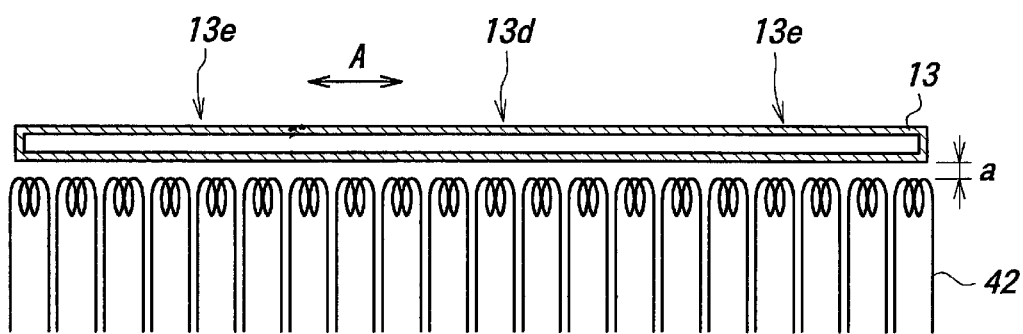
FIG. 4 is a partial sectional view illustrating a state of arranging a plurality of heaters 42 facing to the nozzle 13.

In this embodiment, as illustrated in FIG. 4, a plurality of heaters 42 are arranged in positions facing to the nozzle 13. An amount of heat supplied from each of the heaters 42 to the nozzle 13 is controlled by varying an electric power to be supplied to each of the heaters 42. Preferably, near the central portion 13d of the nozzle 13 as viewed in a direction A perpendicular to the drawing direction, the electric power to be supplied to the heater 42 is increased to relatively increase the amount of heat supplied. At the same time, at the vicinities 13e of both the ends of the planar body of the nozzle 13, the electric power to be supplied to the heater 42 is decreased to relatively decrease the amount of heat supplied.

An amount of heat removed from the vicinities 13e of both the ends of the planar body of the nozzle may also be larger than that removed from the central portion 13d of the nozzle as viewed in a direction perpendicular to the drawing direction.

Figure 5:
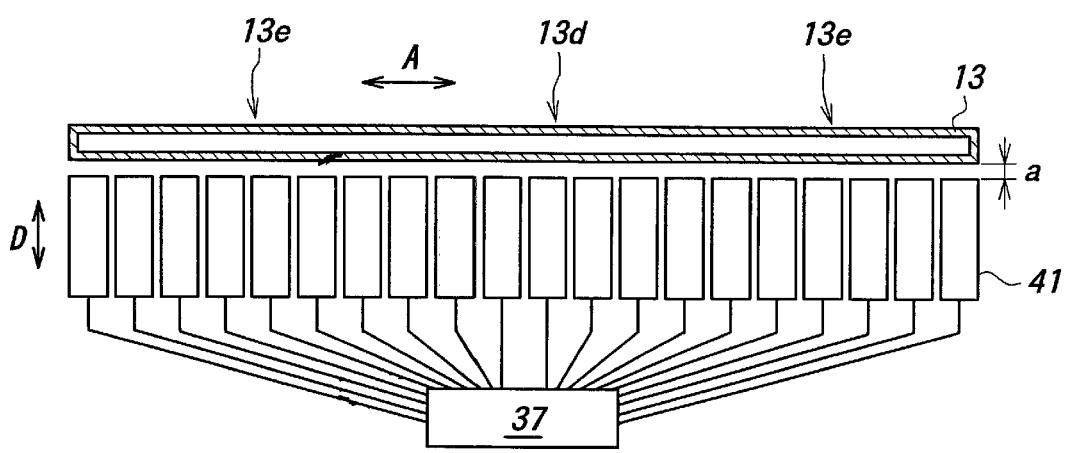
FIG. 5 is a partial sectional view illustrating a state of arranging a plurality of heat-removing blocks 41 facing to the nozzle 13.

Specifically, as shown in FIG. 5, a plurality of heat-removing blocks 41 are provided in positions facing to the nozzle 13, and the amount of heat removed from the nozzle 13 by each of the heat-removing blocks 41 is controlled by adjusting the distance between each of the heat-removing blocks 41 and the nozzle 13. Preferably, near the central portion 13d of the nozzle 13 as viewed in a direction A perpendicular to the drawing direction, the distance "a" between the heat-removing blocks 41 and the nozzle 13 is increased to decrease the amount of heat removed by the heat-removing blocks 41. At the vicinities 13e of both the ends of the planar body of the nozzle 13, the distance "a" between the heat-removing blocks 41 and the nozzle 13 is decreased to increase the amount of heat removed by the heat-removing blocks 41. Such a material as silicon carbide is used for the heat-removing block.

Such a device that supplies a cooling medium can be used as a heat-removing device. Preferably, the cooling device has a blowing hole for blowing out the cooling medium toward the nozzle. Thus, a cooling efficiency can be further improved.

The cooling medium may be either a gas or a liquid. Air, nitrogen, helium or the like may be recited as a gaseous cooling medium. A temperature of the gas is preferably lower by at least 500° C. than that of the anneal region controlled by an after-heater and a lower furnace. Moreover, a liquid may also be used as a cooling medium. In this case, using a mist may improve the cooling efficiency and eliminate a possibility of a steam explosion.

Figure 6:
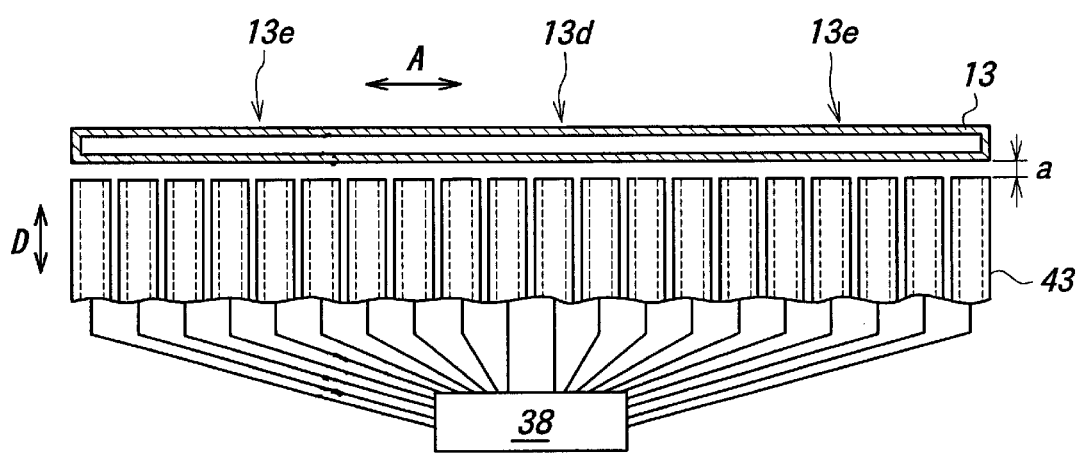
FIG. 6 is a partial sectional view illustrating a state of arranging a plurality of cooling medium-supplying devices 43 facing to the nozzle 13.

As illustrated in FIG. 6, a plurality of devices supplying the cooling medium 43 are provided in positions facing to the nozzle 13. An amount of heat removed from the nozzle by the cooling medium is controlled by adjusting an amount of the cooling medium to be supplied from each of the devices 43 with a medium supplying source 38. When a supplying amount or a supplying rate of the cooling medium is increased, the amount of heat removed by the cooling medium is increased.

Figure 7:
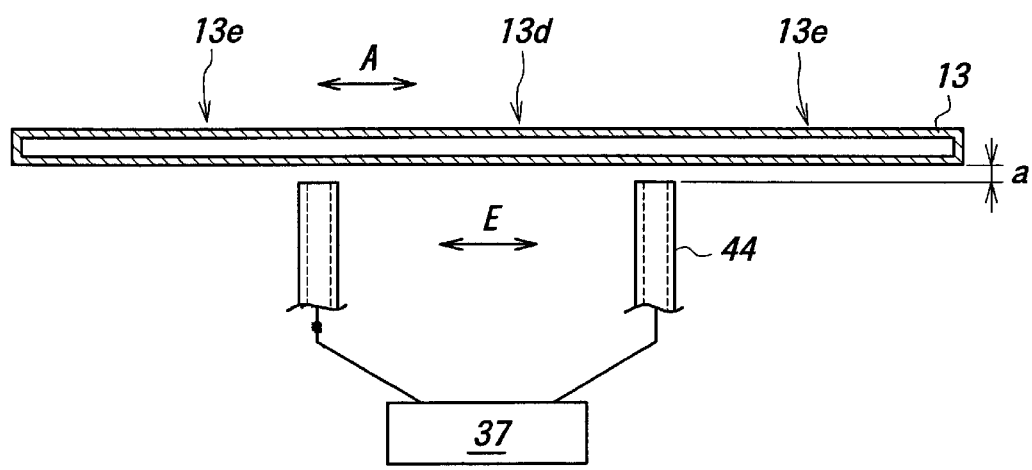
FIG. 7 is a partial sectional view illustrating a state of arranging two cooling medium-supplying devices 44 which is horizontally movable and facing to the nozzle 13.

As shown in FIG. 7, at least one heat-removing device 44 is provided in a position facing to the nozzle 13. A position in a direction A of the heat-removing device 44 is changed (i.e., moved as indicated by the arrow E), as the growth of the planar body progresses. The heat-removing block or the cooling medium-supplying device as mentioned above can be used as the heat-removing device. Particularly preferably, the heat-removing device is moved in positions near both the ends of the shoulder portion of the nozzle, as the growth of the shoulder portion progresses.

The central portion of the nozzle as viewed in a direction perpendicular to the drawing direction includes, for example, a region within 1/10 of the width of the nozzle from the central portion point of the nozzle. The vicinities of both the ends of the planar body of the nozzle includes, for example, a region within 10 mm from both the ends of the planar body as viewed in a direction perpendicular to the drawing direction. Both the ends of the shoulder portion gradually deviate from the center point of the nozzle, as the growth of the shoulder portion progresses.

Heat may be supplied to the central portion of the nozzle as viewed in a direction perpendicular to the pull-down direction and may be removed from the vicinity of both the ends of the planar body of the nozzle. To achieve this, the heaters are arranged to face to the central portion of the nozzle, and the heat-removing devices are arranged to face to the vicinities of both the ends of the planar body of the nozzle.

Figure 8:
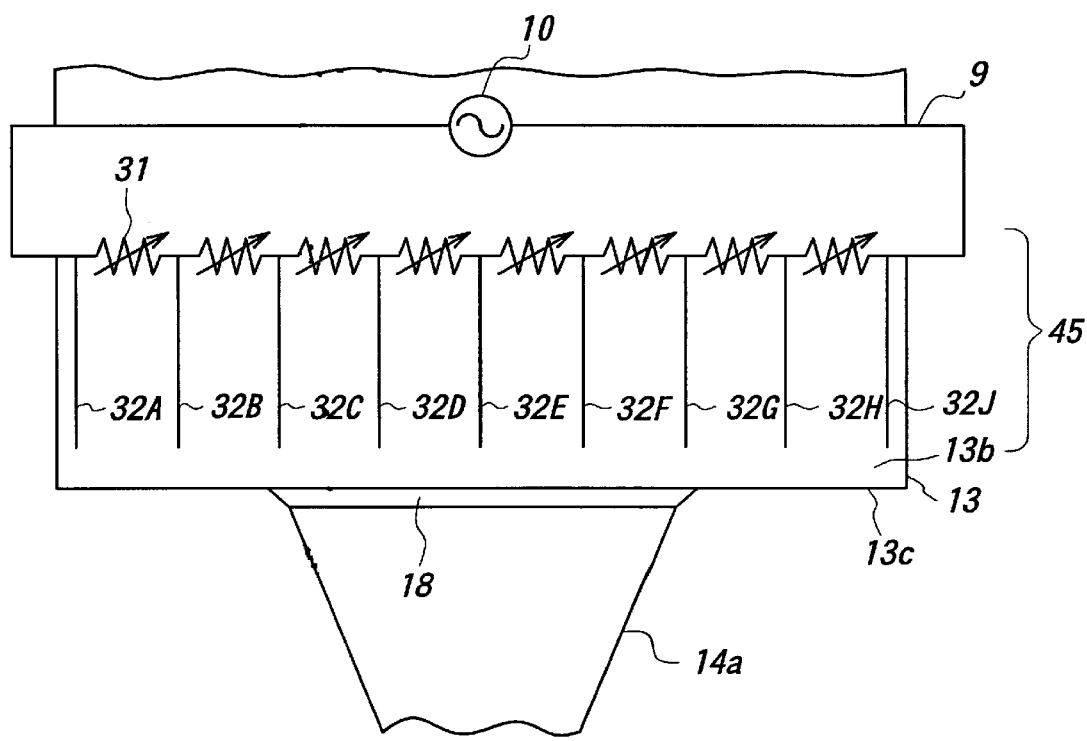
FIG. 8 shows a state of dividing the nozzle 13 into a plurality of blocks and supplying electric power to each of the blocks.

In an embodiment that elevate the temperature of the nozzle by applying an electric power to the nozzle, the amount of electric power to be supplied to the nozzle in the vertical direction against the drawing direction can be controlled. For example, as schematically illustrated in FIG. 8, when the electric power is to be directly supplied to the lower portion of the nozzle 13 with an alternating power source 10 and wires 9, electric cables 32A-32J are provided to arrange variable resistors 31 between each of adjacent electric cables 32A, 32B, 32C, 32D, 32E, 32F, 32G, 32H and 32J. The voltage and the current between the adjacent electric cables can be controlled by regulating the resistances of the variable resistors, thus the electricity supplied to each of the lower portions of the nozzle can be controlled. Further, when the temperature of one of these portions becomes lower than that of the other portions, the resistance of the variable resistor of that portion is increased to raise the temperature. Reference numeral 45 denotes an electricity-conducting unit.

An oxide single crystal is not particularly limited, but, for example, lithium potassium niobate (KLN), lithium potassium niobate-lithium potassium tantalate solid solution (KLTN: [$K_3Li_{2-x}(Ta_yNb_{1-y})_{5+x}O_{15+2x}$]), lithium niobate, lithium tantalate, lithium niobate-lithium tantalate solid solution, $Ba_{1-}Sr_xNb_2O_6$, Mn—Zn ferrite, yttrium aluminum garnet substituted with Nd, Er and/or Yb, YAG, and $YVO_4$ substituted with Nd, Er, and/or Yb can be recited.

According to the present invention, a planar body having a width of particularly 50 mm or more, further 60 mm or more, and yet further 80 mm or more can be readily grown. The width attainable on growing has no particular upper limit, and the wider planar body is more preferable as far as it can be practically grown.

EXAMPLE 1

With a single crystal-producing apparatus shown in FIG. 2, a planar body of a lithium potassium niobate single crystal was produced according to the invention. Specifically, the whole temperature inside the furnace was controlled by the upper furnace unit 1 and the lower furnace unit 3. The apparatus was configured to be able to control the temperature gradient near the single crystal-growing portion 35 by controlling an electric power to be supplied to the nozzle portion 13, heat generated from the after-heater 15 and a flow rate of gas in the heat-removing tube 19. Heat removing blocks 41 as shown in FIG. 5 were also arranged to control the temperature gradient of the nozzle 13 in the horizontal direction. Specifically, twenty heat-removing elements made of silicon carbide were provided at 1 mm intervals, and the distances between the nozzle 13 and each of the heat-removing elements 41 were initially set at 1 mm. Each of the heat-removing elements had a prismatic shape of 4 mm×4 mm in cross-section and 20 mm in length and could move in a direction indicated by arrow D A mechanism of pulling down the single crystal plate was equipped, in which pulled down a single crystal plate at the pulling-down rate controlled uniformly within a range from 2 to 100 mm/hour in a vertical direction.

A fibrous seed crystal of lithium potassium niobate was used. The dimensions of the seed crystal were 1 mm×1 mm in cross-section and 15 mm in length. The seed crystal was bonded to a holding rod with a heat-resistance inorganic adhesive, and the holding rod was connected to the pulling-down mechanism not shown.

Potassium carbonate, lithium carbonate and niobium pentoxide were mixed at a molar ratio of 30:25:45 to produce a raw material powder. The raw material powder was supplied into the platinum crucible 7, and the crucible 7 was set in place. With controlling the temperature of the space 5 in the upper furnace unit 1 within a range from 1100 to 1200° C., the raw material in the crucible 7 was melted. The temperature of the anneal region 20 in the lower furnace unit 3 was controlled uniformly at 700° C. While a given electric power was supplied to each of the crucible 7, the nozzle portion 13 and the after-heater 15 and air was supplied at 50 liter/minute to the cooling tube 19, a single crystal was grown.

The crucible 7 had an elliptical cross-sectional planar shape, wherein the major axis, the minor axis and the height was 100 mm, 10 mm and 10 mm, respectively. The length of the connecting-tube portion was 5 mm. A cross-sectional dimension of the planar expanded portion 13$b$ was 1 mm×100 mm. A dimension of the opening 13$c$ was 1 mm long×100 mm wide. Under such conditions, the seed crystal was contacted to the melt protruded from the opening.

In this case, the temperature of the single crystal-growing portion 35 could be about 1000° C. The temperature gradient under the opening 13$c$ could be controlled at 150° C./mm within a range of 1 mm from the opening 13$c$ of the nozzle portion 13, at 25° C./mm on the average within a range of 1-5 mm, and at 1° C./mm within a range of 5-30 mm.

Under such conditions, the seed crystal 30 was pulled down at a rate of 10 mm/h. As a result, a lower portion of a melt band was gradually crystallized to form a shoulder portion. While the raw material in equal weight to that of the crystallized melt was being fed to the crucible 7, the crystal was kept growing. When the seed crystal was further lowered, an area of the shoulder portion gradually increased. However, as the width of the shoulder portion became larger, the temperature of the central portion of the nozzle 13 became lower due to a radiation through the single crystal. Therefore, the amount of removed heat was decreased by increasing the distance between the heat-removing element 41 near the central portion of the nozzle 13 and the nozzle, and the temperature distribution of the nozzle in the horizontal direction was maintained uniformly. By repeating such operation as the growth of the crystal was progressing, the width of the shoulder portion gradually enlarged to finally reach 80 mm in width and 1 mm in thickness.

While the width was kept at 80 mm and the raw material in equal weight to that of the crystallized melt was being fed to the crucible, the crystal was kept growing until the total length of the shoulder portion and the planar body reached 150 mm, then the planar body was cut off from the nozzle and was gradually cooled.

The lattice constant of the shoulder portion of the obtained planar body was measured to give the a-axis length of 12.57 Å and the c-axis length of 4.03 Å. A molar ratio of potassium, lithium and niobium was 30:18:52, respectively. A half width of an X-ray rocking curve was 50 seconds. No crack occurred during growing and gradually cooling the crystal.

EXAMPLE 2

A planar body was grown according to Example 1 except that heaters were arranged as shown in FIG. 4 and were composed of platinum-rhodium alloy wire each having a diameter of 1 mm and a width of 4 mm. Each space between the adjacent heaters 42 was set to 1 mm, and twenty heaters were arranged. As the width of the shoulder portion was enlarged, the horizontal temperature distribution of the nozzle 13 was maintained uniformly to obtain a planar body similar to that of Example 1 by elevating the output of the heater near the central portion of the nozzle 13.

EXAMPLE 3

A planar body was grown according to Example 1 except that cooling medium-blowing devices 43 were arranged as shown in FIG. 6. The device 43 were consisted of alumina tubes each having an outer diameter of 4 mm, and the flow rate of air through each of the alumina tubes 43 could be controlled independently. Each space between the adjacent alumina tubes was set to 1 mm, and twenty alumina tubes were arranged.

As the width of the shoulder portion was enlarged, the temperature of the central portion of the nozzle 13 was decreased due to a radiation through the single crystal. To compensate such decrease, the whole amount of the electric power to be supplied to the nozzle 13 was increased to hold the temperature of the central portion at the optimum temperature. In this condition, since the temperature of both the ends of the nozzle 13 as viewed in a direction perpendicular to the nozzle was raised and the width of the shoulder portion stopped increasing, air was blown from the alumina tubes 43 arranged at both the ends of the nozzle 13 to the nozzle 13 to maintain the horizontal temperature distribution of the nozzle 13 uniform, and then a planar body similar to that of Example 1 was obtained.

EXAMPLE 4

A planar body was grown according to Example 1 except that two cooling medium-blowing devices 44 were arranged as shown in FIG. 7. The device 44 were composed of alumina tubes having an outer diameter of 6 mm, and each of the flow rate of air in the alumina tubes 44 could be controlled independently.

As the width of the shoulder portion was enlarged, the temperature of the central portion of the nozzle 13 was decreased due to a radiation through the single crystal. To compensate such decrease, the whole amount of the electric power to be supplied to the nozzle 13 was increased to hold the temperature of the central portion at the optimum temperature. In this condition, since the temperature of both the ends of the nozzle 13 as viewed in a direction perpendicular to the nozzle was raised and the width of the shoulder portion stopped increasing, air was blown at 1 liter/min. through the alumina tubes 44 to the places being 5 mm apart from both the ends of the shoulder portion to reduce the temperature of the nozzle near the crystal growing point, thus the growth of the width of the shoulder portion was accelerated. As the width of the shoulder portion grew further, the alumina tubes 44 were shifted so that the alumina tubes 44 were placed at 5 mm from the end of the shoulder portion. As a result, a planar body similar to that of Example 1 was obtained.

EXAMPLE 5

A planar body was grown according to Example 1 except that an electricity-conduction unit 45 was used as shown in FIG. 8. Each space between the adjacent supplying cables 32A-32J was set to 5 mm. At the beginning of the growth, the supplied electric power was made identical between the adjacent cables over the entire nozzle 13. Since the temperature near the central portion of the nozzle 13 began to decrease as the width of the shoulder portion was enlarged, the supplied electric power near the central portion of the nozzle was increased to make the temperature of the nozzle 13 uniform as viewed in the horizontal direction. As a result, a planar body similar to that of Example 1 was obtained.

COMPARATIVE EXAMPLE 1

A planar body was grown according to Example 1 except that a heat-removing unit of FIG. 5 was not installed. As a result, the temperature near the central portion of the nozzle 13 was decreased due to a radiation through the single crystal in connection with the growth of the shoulder portion, and the crystallization of the melted raw material was accelerated at near the central portion. When the width of the single crystal reached 50 mm, the nozzle was contacted to the single crystal at near the central portion of the nozzle 13 to cause deterioration in the single crystal.

COMPARATIVE EXAMPLE 2

A planar body was grown according to Comparative Example 1. The temperature near the central portion of the nozzle 13 was decreased due to a radiation through the single crystal in connection with the growth of the shoulder portion. For this reason, such deterioration as in Comparative Example 1 was prevented by increasing an amount of the electric power to be supplied to the nozzle 13 to raise the temperature of the entire nozzle 13. As a result, when the width of the single crystal reached 50 mm, the growth of the single crystal in the width direction was stopped.

As mentioned above, according to the invention, when the planar body of the oxide single crystal was grown by the $\mu$ pulling-down method, the width of the shoulder portion can be increased, and polycrystal regions, cracks and deteriorations near the central portion of the planar body can be prevented.

What is claimed is:

1. A process for producing a planar body of an oxide single crystal, said process comprising the steps of melting a raw material of said oxide single crystal in a crucible, contacting a seed crystal to a melt of the raw material near an opening of a nozzle of the crucible, drawing said melt from said opening by pulling down the seed crystal, and growing said planar body, wherein the temperature distribution of said nozzle in a direction perpendicular to said drawing direction is controlled by any one of supplying heat to the nozzle and removing heat from the nozzle.

2. A process for producing a planar body of an oxide single crystal according to claim 1, wherein an amount of heat supplied to near both ends of said planar body of the nozzle is smaller than that supplied to a central portion of the nozzle as viewed in a direction perpendicular to said drawing direction.

3. A process for producing a planar body of an oxide single crystal according to claim 1, wherein a plurality of heaters are provided in positions facing said nozzle, and an amount of heat supplied from each of said heaters to the nozzle is controlled by varying an electric power supplied to each of said heaters.

4. A process for producing a planar body of an oxide single crystal according to claim 3, wherein said planar body is grown such that a shoulder portion is formed.

5. A process for producing a planar body of an oxide single crystal according to claim 3, wherein an angle of gradient against said drawing direction of a shoulder portion of the planar body is observed and said temperature distribution of the nozzle is controlled depending on the angle of gradient while said oxide single crystal is being grown.

6. A process for producing a planar body of an oxide single crystal according to claim 1, wherein an amount of electricity supplied to said nozzle is controlled in a direction perpendicular to said drawing direction when the nozzle is heated by supplying electricity to the nozzle.

7. A process for producing a planar body of an oxide single crystal according to claim 6, wherein said planar body is grown such that a shoulder portion is formed.

8. A process for producing a planar body of an oxide single crystal according to claim 6, wherein an angle of gradient against said drawing direction of a shoulder portion of the planar body is observed and said temperature distribution of the nozzle is controlled depending on the angle of gradient while said oxide single crystal is being grown.

9. A process for producing a planar body of an oxide single crystal according to claim 1, wherein an amount of heat removed from near both ends of said planar body of the nozzle is larger than that removed from a central portion of the nozzle as viewed in a direction perpendicular to said drawing direction.

10. A process for producing a planar body of an oxide single crystal according to claim 1, wherein a plurality of heat-removing blocks are provided in positions facing said nozzle, and an amount of heat removed from said nozzle by each of the heat-removing blocks is controlled by adjusting the distances between each of the heat-removing blocks and the nozzle.

11. A process for producing a planar body of an oxide single crystal according to claim 10, wherein said planar body is grown such that a shoulder portion is formed.

12. A process for producing a planar body of an oxide single crystal according to claim 10, wherein an angle of gradient against said drawing direction of a shoulder portion of the planar body is observed and said temperature distribution of the nozzle is controlled depending on the angle of gradient while said oxide single crystal is being grown.

13. A process for producing a planar body of an oxide single crystal according to claim 1, wherein a plurality of devices for supplying cooling medium are provided in positions facing said nozzle, and an amount of heat removed from said nozzle by the cooling medium is controlled by adjusting an amount of the cooling medium supplied from each of the cooling medium-supplying devices.

14. A process for producing a planar body of an oxide single crystal according to claim 13, wherein said planar body is grown such that a shoulder portion is formed.

15. A process for producing a planar body of an oxide single crystal according to claim 13, wherein an angle of gradient against said drawing direction of a shoulder portion of the planar body is observed and said temperature distribution of the nozzle is controlled depending on the angle of gradient while said oxide single crystal is being grown.

16. A process for producing a planar body of an oxide single crystal according to claim 1, wherein at least one heat-removing device is provided in a position facing said nozzle, and said position of the heat-removing device is varied, as viewed in a direction perpendicular to the drawing direction, as the growth of said planar body progresses.

17. A process for producing a planar body of an oxide single crystal according to claim 16, wherein said planar body is grown such that a shoulder portion is formed.

18. A process for producing a planar body of an oxide singe crystal according to claim 16, wherein an angle of gradient against said drawing direction of a shoulder portion of the planar body is observed and said temperature distribution of the nozzle is controlled depending on the angle of gradient while said oxide single crystal is being grown.

19. A process for producing a planar body of an oxide single crystal according to claim 1, wherein heat is supplied to a central portion of said nozzle as viewed in a direction perpendicular to said drawing direction, and heat is removed from near end portions of a planar body of the nozzle.

20. A process for producing a planar body of an oxide single crystal according to claim 1, wherein said planar body is grown such that a shoulder portion is formed.

21. A process for producing a planar body of an oxide single crystal according to claim 1, wherein an angle of gradient against said drawing direction of a shoulder portion of the planar body is observed and said temperature distribution of the nozzle is controlled depending on the angle of gradient while said oxide single crystal is being grown.

22. An apparatus for producing a planar body of an oxide single crystal comprising a crucible for melting a raw material of said oxide single crystal and a temperature controlling unit, said crucible having a nozzle provided with an opening and a seed crystal contacts a melt of said raw material and the oxide single crystal is grown by pulling down the seed crystal to draw the melt from said opening of the nozzle, and said temperature controlling unit controls a temperature distribution of said nozzle in a direction perpendicular to said drawing direction by any one of supplying heat to the nozzle and removing heat from the nozzle.

23. An apparatus for producing a planar body of an oxide single crystal according to claim 22, further comprising a plurality of heaters provided in positions facing said nozzle.

24. An apparatus for producing a planar body of an oxide single crystal according to claim 22, further comprising an electricity-supplying unit for regulating the amount of electricity supplied to said nozzle in a direction perpendicular to said drawing direction when the nozzle is heated by supplying electricity to the nozzle.

25. An apparatus for producing a planar body of an oxide single crystal according to claim 22, further comprising a plurality of heat-removing blocks provided in positions facing said nozzle and a driving device for varying the distance between each of the heat-removing blocks and the nozzle.

26. An apparatus for producing a planar body of an oxide single crystal according to claim 22, further comprising a plurality of cooling medium-supplying devices provided in positions facing said nozzle.

* * * * *

UNITED STATES PATENT AND TRADEMARK OFFICE
CERTIFICATE OF CORRECTION

PATENT NO. : 6,565,654 B2
DATED : May 20, 2003
INVENTOR(S) : Toshihisa Yokoyama et al.

Page 1 of 1

It is certified that error appears in the above-identified patent and that said Letters Patent is hereby corrected as shown below:

Column 1,
Line 67, please change "the desired size, temperatures of such as a nozzle portion are" to -- the desired size, temperatures, such as a nozzle portion, are --

Column 2,
Lines 28-29, please change "said process comprising" to -- including --
Lines 29, 35, 39 and 41, please change "said" to -- the --
Line 32, please change "said" (first occurrence) to -- the --
Line 33, please change "said planar body," to -- the planar body. --
Line 34, please change "wherein the" to -- The --
Lines 38-39, please change "comprising" to -- including --
Line 40, please change "and temperature controlling unit, said crucible" to -- and a temperature controlling unit. The crucible --
Lines 40-41, please change "having" to -- has --
Line 42, please change "controlling" (second occurrence) to -- controls --
Line 43, please change "said" (first and second occurrences) to -- the --
Line 45, please change "nozzle, wherein a" to -- nozzle. A --
please change "said" to -- the --
Line 47, please change "said" (both occurrences) to -- the --
Lines 61, 63 and 67, please change "to" to -- toward --

Column 3,
Line 3, please change "to" to -- toward --
Line 32, please change "stop" to -- stops --
Line 38, please change "didn't" to -- did not --

Signed and Sealed this

Fourth Day of November, 2003

JAMES E. ROGAN
*Director of the United States Patent and Trademark Office*